United States Patent
Kokalj-Filipovic et al.

(10) Patent No.: US 9,203,427 B2
(45) Date of Patent: Dec. 1, 2015

(54) SYSTEM AND METHOD FOR MITIGATING THE CLIFF EFFECT FOR CONTENT DELIVERY OVER A HETEROGENEOUS NETWORK

(75) Inventors: Silvija Kokalj-Filipovic, Princeton Junction, NJ (US); Emina Soljanin, Green Village, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 1024 days.

(21) Appl. No.: 13/024,509

(22) Filed: Feb. 10, 2011

(65) Prior Publication Data

US 2012/0207209 A1    Aug. 16, 2012

(51) Int. Cl.
  *H04N 7/26* (2006.01)
  *H03M 7/30* (2006.01)
  *H04N 19/39* (2014.01)
  *H04L 1/00* (2006.01)
  (Continued)

(52) U.S. Cl.
  CPC ............... *H03M 7/30* (2013.01); *H04L 1/0009* (2013.01); *H04L 1/0014* (2013.01); *H04L 1/0042* (2013.01); *H04N 19/39* (2014.11); *H04N 19/124* (2014.11); *H04N 19/176* (2014.11)

(58) Field of Classification Search
  CPC ... H04N 19/39; H04N 19/124; H04N 19/176; H03M 7/30; H04L 1/0009; H04L 1/0042
  See application file for complete search history.

(56) References Cited

U.S. PATENT DOCUMENTS

| 6,330,370 | B2* | 12/2001 | Goyal et al. | 382/251 |
| 6,996,618 | B2* | 2/2006 | Apostolopoulos et al. | 709/227 |
| 7,720,299 | B2* | 5/2010 | Hou | 382/250 |

(Continued)

FOREIGN PATENT DOCUMENTS

| EP | 1615441 A1 | 6/2004 |
| EP | 2146436 A1 | 1/2010 |

OTHER PUBLICATIONS

S. S. Pradhan et al., "n-channel symmetric multiple descriptions—part I: (n, k)source-channel erasure codes," IEEE Trans. Inf. Theory, vol. 50, pp. 47-61, Jan. 2004.*

(Continued)

*Primary Examiner* — Behrooz Senfi
*Assistant Examiner* — Maria Vazquez Colon
(74) *Attorney, Agent, or Firm* — Hitt Gaines, P.C.

(57) ABSTRACT

A transmitter, receiver and method for mitigating the cliff effect for content delivery over a heterogeneous network. In one embodiment, the transmitter includes: (1) a joint encoder configured to receive a content unit and generate multiple quantized representations thereof and (2) an erasing quantizer associated with the joint encoder and configured to select, from uncoded symbols representing the content unit, multiple subsets of the uncoded symbols. The multiple quantized representations and the multiple subsets of the uncoded symbols are associated to form multiple, independently quantized, correlated descriptions of the content unit. Two design parameters may be employed to control the level of correlation. In one embodiment, the receiver includes: (1) a joint decoder configured to decode quantized representations extracted from received descriptions representing a content unit and (2) a summing junction associated with the joint decoder and configured to employ at least one uncoded symbol representing the content unit to compensate for at least one corresponding symbol that the joint decoder failed to decode.

19 Claims, 5 Drawing Sheets

(51) Int. Cl.
*H04N 19/124* (2014.01)
*H04N 19/176* (2014.01)

(56) References Cited

U.S. PATENT DOCUMENTS

2008/0123739 A1* 5/2008 Reznic et al. ............ 375/240.08
2012/0189047 A1* 7/2012 Jiang et al. ............... 375/240.01

OTHER PUBLICATIONS

Ahmed et al. (Feb. 15, 2010; Draft Erasure Multiple Descriptions. Retrieved Apr. 2, 2014, from http://arxiv.org/abs/1002.2971).*
S. S. Pradhan et al. ("n-channel symmetric multiple descriptions—part I: (n, k) source-channel erasure codes," IEEE Trans. Inf. Theory, vol. 50, pp. 47-61, Jan. 2004).*
Ahmed and Wagner; Binary erasure multiple descriptions: Average-case distortion. In IEEE Information Theory Workshop (ITW); Jun. 2009.
Goyal; Multiple description coding: Compression meets the network; IEEE Sep. 2001.
Jakubczak and Katabi; Softcast: one-size-fits-all wireless video; pp. 449-450; 2010.
Wang; Vector Gaussian Multiple Description with Individual and Central Receivers; 2007 IEEE; pp. 2133-2153.
Pradhan, Puri and Ramchandran; n-channel symmetric multiple descriptions—part i: (n,k) source-channel erasure codes; IEEE Jan. 2004.
Puri, Pradhan and Ramchandran; n-channel symmetric multiple descriptions—part ii: an achievable rate-distortion region; IEEE Apr. 2005.
Goyal; Multiple Description Coding: Compression Meets the Network; IEEE Sep. 2001; pp. 74-93.
Zhang and Berger; New Results in Binary Multiple Descriptions; IEEE Jul. 1987; pp. 502-521.
Chen; Rate Region of Gaussian Multiple Description Coding with Individual and Central Distortion Constraints; IEEE 2009; pp. 3991-4005.
Pradhan, Puri and Ramchandran; (n,k) Source-Channel Erasure Codes: Can Parity Bits also Refine Quality?; 2001 Conference on Information Sciences and Systems, The Johns Hopkins University, Mar. 21-23, 2001; 6 pages.
Tian; New Coding Schemes for the Symmetric K—Description Problem; Oct. 2010 IEEE pp. 5344-5365.
Tong Gan, et al., "Sliding-Window Packetization for Unequal Loss Protection Based Multiple Description Coding," IEEE, 2003, pp. 641-644.
Silvija Kokalj-Filipovic, et al., "Cliff Effect Suppression through Multiple-Descriptions with Split Personality," IEEE International Symposium on Information Theory Proceedings, 2011, pp. 948-952.
Goyal, V.K., "Multiple Description Coding: Compression Meets the Network," IEEE Signal Processing Magazine, Sep. 2001, pp. 74-93.
Ahmed, E., et al., "Erasure Multiple Descriptions," Cornell University, Feb. 15, 2010, 48 pages, http://arxiv.org/pdf/1002.2971.pdf.

* cited by examiner

SYSTEM AND METHOD FOR MITIGATING THE CLIFF EFFECT FOR CONTENT DELIVERY OVER A HETEROGENEOUS NETWORK

TECHNICAL FIELD

This application is directed, in general, to digital communications and, more specifically, to mitigation of the cliff effect, which adversely affects the quality of the content being delivered, or content delivery rates achievable, over a heterogeneous digital network.

BACKGROUND

One might expect that the quality of content received over a digital channel degrades smoothly as channel quality decreases. In actuality however, the quality of the received content suddenly and precipitously drops when channel quality falls below a certain critical point. Those skilled in the art of digital communications call this the "cliff effect." Conversely (and counterintuitively), if the channel quality is above the critical point, the quality of the received content is no better than at the critical point.

While the cliff effect is inherent in digital communications, it has not presented a practical problem until recently, because most digital content was heretofore delivered point-to-point (unicast) over networks having fairly constant channel quality. Transmitters of point-to-point communications have the benefit of sensing the characteristics of the channel to be employed. Based on those characteristics, the transmitters can use conventional source coding and channel coding techniques to encode the content for those characteristics and mitigate the cliff effect.

However, today's digital networks (e.g., dedicated content distribution networks and mobile and wireless networks) are tasked with delivering content over diverse channel conditions to heterogeneous users. As a result, the cliff effect has become a significant impediment to efficient multicast communications. Consequently, when streaming content is simultaneously delivered to multiple users, not only do the recipients whose channel quality is below the critical point receive unusable streams, the recipients whose channel quality is above (even significantly above) the critical point receive no benefit from the enhanced quality of their channels.

SUMMARY

One aspect provides a transmitter for mitigating the cliff effect for content delivery over a heterogeneous network. In one embodiment, the transmitter includes: (1) a joint encoder configured to receive a content unit and generate multiple quantized representations thereof and (2) an erasing quantizer associated with the joint encoder and configured to select, from uncoded symbols representing the content unit, multiple subsets of the uncoded symbols. The multiple quantized representations and the multiple subsets of the uncoded symbols are associated to form multiple, independently quantized, correlated descriptions of the content unit. Two design parameters may be employed to control the level of correlation.

Another aspect provides a method of mitigating the cliff effect for content delivery over a heterogeneous network. In one embodiment, the method includes: (1) encoding a content unit to yield a quantized representation of a particular rate, (2) selecting only a subset of uncoded content unit symbols, (3) queuing the quantized representation and the subset of uncoded unit symbols for transmission over a network and (4) repeating the encoding, selecting and queuing for other hybrid descriptions to be generated.

Yet another aspect provides a receiver for mitigating the cliff effect for content delivery over a heterogeneous network. In one embodiment, the receiver includes: (1) a joint decoder configured to decode quantized representations extracted from received descriptions representing a content unit and (2) a summing junction associated with the joint decoder and configured to employ at least one uncoded symbol representing the content unit to compensate for at least one corresponding symbol that the joint decoder failed to decode.

BRIEF DESCRIPTION

Reference is now made to the following descriptions taken in conjunction with the accompanying drawings, in which.

DETAILED DESCRIPTION

Although the cliff effect has not presented a practical problem until recently, some attempts have been made to mitigate it. Some approaches involve multiple encodings. Representative of these attempts are Microsoft's Smooth Streaming™ and MIT's Softcast™. Unfortunately, both Smooth Streaming™ and Softcast™ are of limited use, because they require exceptional transmission or storage resources. For example, Smooth Streaming™ requires not only channel quality information to be fed back from each receiver to the transmitter but also abundant storage space to store different versions of the same content for different channel qualities. Softcast™ requires prohibitively large transmission bandwidth, as each real-number representation of a pixel requires yet another number to be sent to the receiver, and no mechanism is provided to control the rate-distortion tradeoff.

Other approaches focus on adaptive channel coding, such as those employing hybrid automatic repeat request (HARQ) techniques. Unfortunately, adaptive channel coding results in a relatively crude degradation of content reconstruction quality as channel quality deteriorates. When the content is video content, adaptive channel coding reduces delay but fails to improve the picture quality (because source coding determines picture quality).

Yet other approaches focus on adaptive source coding, such as the Scalable Video Coding (SVC) extension of the well-known IEEE H.264 video compression standard. Adaptive source coding employs successive refinement or progressive (multi-layer) coding, all resulting in scalable content representations of each unit (e.g., a frame of video or segment of audio or computer data) of content. A single, base-layer representation and one or more enhanced-layer representations are generated for each unit. Because the one or more enhanced-layer representations are dependent upon their corresponding base-layer representation, packets containing the base-layer representations must be received before their corresponding enhanced-layer representations if the latter are to be used. Unfortunately, network congestion frequently delays the delivery of base-layer packets to the degree that they are unavailable when needed. Therefore not only is the base layer for that unit lost, so is any corresponding enhanced layer.

Figure 1:
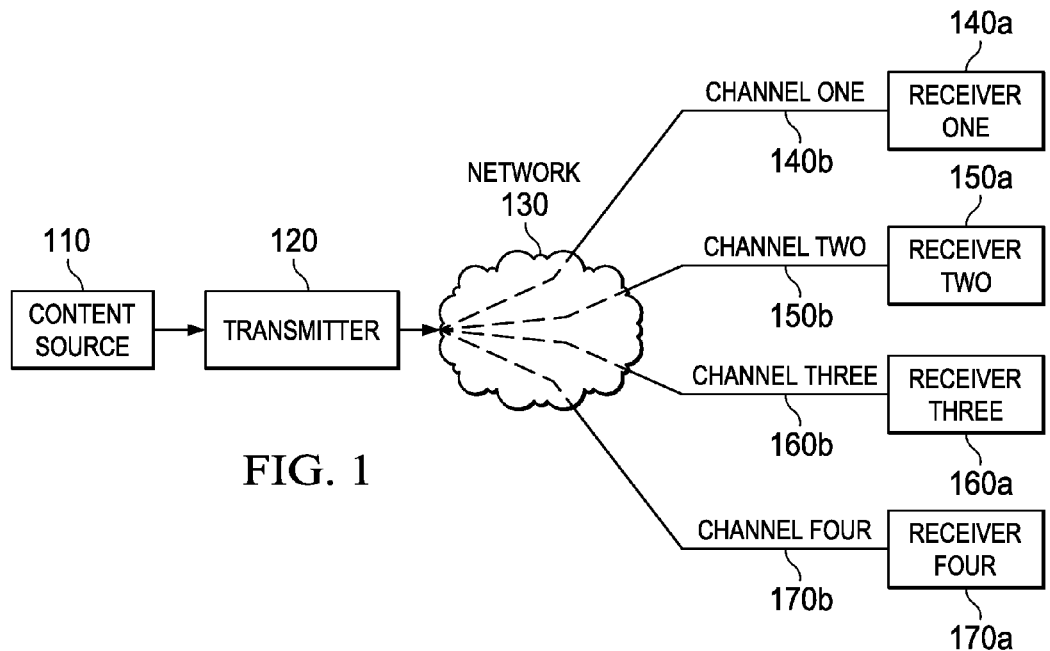
FIG. 1 is a block diagram of one embodiment of a transmitter, various receivers and a network interposed therebetween in which system or method for mitigating the cliff effect for content delivery over a heterogeneous network may operate.

Before describing various embodiments of a system and method for mitigating the cliff effect for content delivery over a heterogeneous network, a representative environment will be shown and described. FIG. 1 is a block diagram of one embodiment of a transmitter 120, various receivers 140a, 150a, 160a, 170a and a network 130 interposed therebetween in which system or method for mitigating the cliff effect for content delivery over a heterogeneous network may operate. A content source 110 contains content to be transmitted in the form of multiple descriptions from the transmitter 120 to the receivers 140a, 150a, 160a, 170a via channels 140b, 150b, 160b, 170b of the network 130, each channel corresponding to a number of "subchannels," each conveying one description (quantized representation) of the content. In the illustrated embodiment, at least some of the receivers 140a, 150a, 160a, 170a are heterogeneous (of different type), and hence receives, over its channel, a different number of descriptions than the others. Also in the illustrated embodiment, at least one of the channels 140b, 150b, 160b, 170b changes in terms of quality over time, and, hence, is receiving different number of descriptions over time, corresponding to a channel composed of a varying number of subchannels.

Introduced herein are various embodiments of a system and method for mitigating the cliff effect for content delivery over a heterogeneous network. In general, the various embodiments employ a joint source-channel coding technique that carries out multiple-description (MD) coding based on the channel characteristics. Some embodiments of the joint source-channel coding technique provide at least a near-optimal solution for the cliff effect.

The following terms are defined for purposes of this disclosure. "Content" is defined as any digital data, including streaming data, and encompasses analog data converted to digital form and digital audio, video and computer programs and data. A "heterogeneous network" is defined as a network that includes more than one type of receiver, different access technologies, different physical mediums of network links, different distribution layers (e.g., overlay networks, peer-to-peer networks, content-delivery networks), which can be all ultimately described by a heterogeneous node upload bandwidth. "MD coding" is defined as the use of multiple, independently quantized representations to describe a unit of content (e.g., a frame of video or temporal segment of audio). Unlike SVC, MD coding yields representations that are self-contained; there are no base-layer representations upon which other (e.g., enhanced-layer) representations are dependent.

Figure 2:
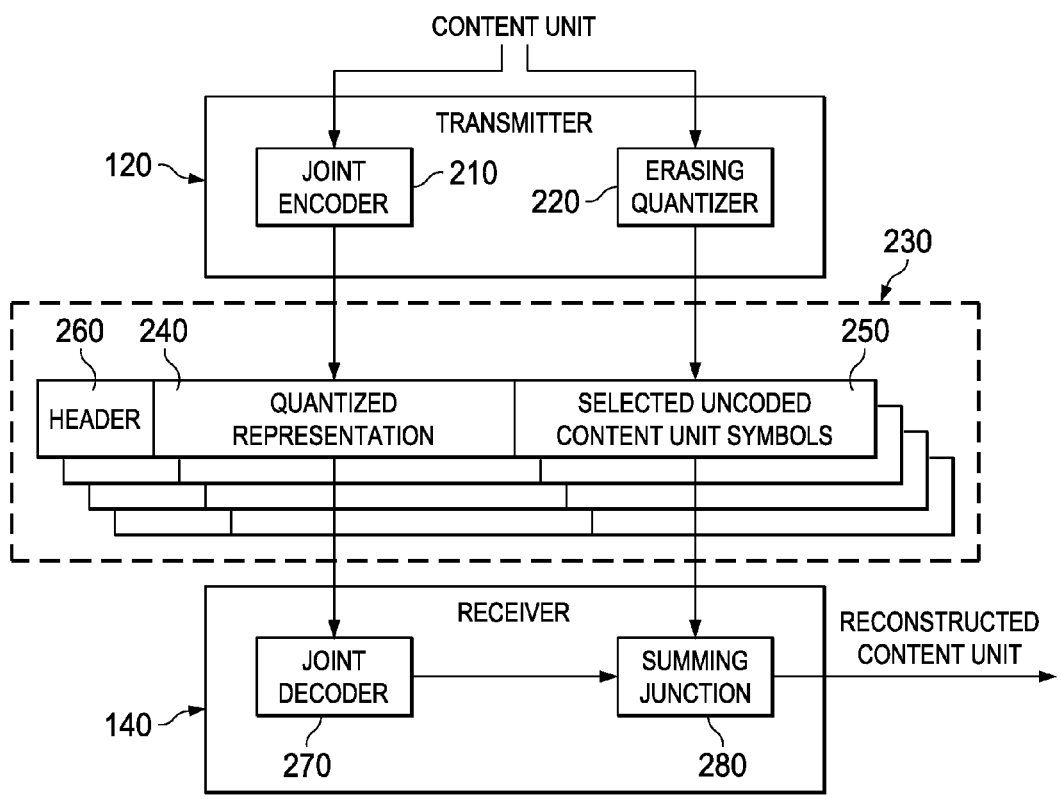
FIG. 2 shows one embodiment of a system for mitigating the cliff effect for content delivery over a heterogeneous network.

FIG. 2 shows one embodiment of a system for mitigating the cliff effect for content delivery over a heterogeneous network. The transmitter 120 of FIG. 1 is illustrated in FIG. 2 as including a joint encoder 210 and an erasing quantizer 220.

The joint encoder 210 may be any joint encoder configured to generate multiple quantized representations of the content unit, each resulting in optimally small distortion for its information rate. The joint encoder 210 may alternatively be made up of multiple instances of a state-of-the-art or later-developed encoder configured to generate a single quantized representation of the content unit. The joint encoder 210 is suited to encode the content. For example, if the content is a video stream, the encoder may implement classical video compression algorithm composed of a linear transform (DCT), a (non-linear) quantizer and an entropy encoder, or an encoder based on linear codes (e.g., FFmpeg, QuickTime™ H.264, Huffyuv or 3ivx).

In general, the erasing quantizer 220 is configured to select, from the uncoded symbols representing the content unit, multiple subsets of the uncoded symbols. In various embodiments, the erasing quantizer 220 is configured to erase symbols based on the information rate allocated to it, i.e., the number of uncoded symbols per description is calculated according to the rate splitting parameter. The unerased symbols differ from one description to another. In particular, the erasing quantizer may select multiple blocks of successive uncoded symbols that are adjacent in the original sequence, and erase the remaining tail of the sequence. However, depending on the content and the application, this may cause deforming artifacts in the content reconstruction, and, hence, the original sequence is first permuted, and then adjacent blocks are selected as subsets to be transmitted. Some embodiments of the erasing quantizer 220 will be described in detail below.

A unit of content is provided to both the joint encoder 210 and the erasing quantizer 220. As stated above, the joint encoder 210 is configured to generate multiple quantized representations of the content unit. The erasing quantizer 220 is configured to erase some symbols and, by this process, select other symbols.

With continuing reference to FIG. 2, the output of the joint encoder 210, taking the form of quantized representations, is provided to respective packets 230. Thus, each packet contains a quantized representation 240 corresponding to a particular description (i.e., for a particular rate). Likewise, the output of the erasing encoder 220, taking the form of selected uncoded content unit symbols, is provided to the respective packets 230. Thus, each packet contains selected uncoded content unit symbols 250. Together with corresponding headers 260, the packets contain independently quantized but correlated descriptions, at given rates, of the content unit provided to the transmitter 120.

While some embodiments of the system and method provide descriptions that allow content reconstructions to improve linearly as further descriptions are taken into account, other embodiments optimize the descriptions by tailoring them for likelier channel states.

Some embodiments to be illustrated and described herein employ descriptions having compression rates based on a channel quality quantization technique that employs a statistical description of the channel used for delivering the content. Irrespective of how the compression rates may be determined, they are then split in two parts: one allocated to the output of a lossy encoder (which may be an optimal rate-distortion encoder), and another allocated to uncoded source symbols. For each description, packets having corresponding parts bearing the output of the encoder and the uncoded source symbols are then transmitted over the network to each receiver.

Various receivers receive at least some of the packets 230 following transmission over the network. Each of the receivers may be a different type (e.g., of different aspect ratios, bitrates, resolutions or "definitions," as that term is employed in the television art) or of the same type, but varying over time (i.e., assuming channel conditions vary over time). In various embodiments to be illustrated and described, distinct receivers are employed to model different channel conditions. Each of the receivers is configured to reconstruct the content based on least one of the descriptions.

As FIG. 2 indicates, one representative receiver 140 includes a joint decoder 270 and a summing junction 280. The joint decoder 270 is configured to decode one or more of the descriptions it receives. It is assumed that the descriptions decoded are appropriate for the type of receiver 140 (as the header 260 indicates in one embodiment) and are received in time to employ the content unit described in the descriptions. Per FIG. 2, the joint decoder 270 is configured to decode the quantized representation 240 (along with the quantized representations of any other decoded descriptions) and provide its output to the summing junction 280. The summing junction 280 is associated with the joint decoder 270 and is configured to employ at least one uncoded content unit symbol (along with one or more corresponding uncoded content unit symbols of any other received descriptions) to compensate for at least one corresponding symbol that the joint decoder failed to decode to yield a reconstruction of the content unit. The reconstructed content unit may then be played, stored or otherwise processed as a particular application may dictate.

The joint encoder 210 can be configured (e.g., through programmable software parameters) in terms of a maximum number of descriptions m and a rate-splitting ratio x to achieve operating points close to an optimal rate-distortion curve over corresponding multiple channel states. In one embodiment, a statistical description of the states of the channel (or performance statistics of the network) is employed to set m and x to converge to at least near-optimal operation regardless of the current state of the channel or network.

In the following description, attention will be directed to the symmetric case, in which the rates R associated with single descriptions are equal to one another, and the distortion depends on the number of received descriptions only. Hence, only m distinct receivers (decoders) and m reconstructions exist for m descriptions. The rate R coincides with the capacity of a subchannel obtained by splitting the maximum available transmission capacity into m disjoint channels. Therefore, each description is sent over a disjoint channel, assuming one exists given the actual transmission capacity.

For each description, the rate R is then split into $R_1 = R/x$, (where x>1) and $R_2 = R - R_1$. Packets are then defined for each description. In one embodiment to be illustrated and described, each packet contains both the output of a quantizer designed optimally in terms of Shannon rate-distortion for the rate $R_1$ and the output of the erasing quantizer. The erasing quantizer is configured to remove uncoded source symbols having a probability $(1 - R_2)$ and leave the remaining (selected) uncoded symbols for transmission in the packets.

The output of the optimal quantizer will be referred to as the Q output, and the output of the erasing quantizer will be referred to as the E output. In the illustrated embodiment, the input of each $R_1$-optimal quantizer is independently quantized from the inputs of $R_1$-optimal quantizers generating other descriptions, while erasures created by the erasing quantizers in different descriptions are disjoint. As a result, each received description contributes to the reconstruction quality not only because each description likely adds different uncoded symbols from its E output, but also due to the decreased quantization error, as each Q output represents a distorted but independent (and hence innovative) look at the source.

Conventional video encoders employ a linear transformation to project pixels of an image's macroblock onto a suitable basis, such that only a small number of significant transform coefficients well describe the macroblock. Designers of such encoders define a threshold of significance that, in turn, defines how many coefficients are kept and what is their numerical range and precision level (i.e., the number of bits each coefficient is to represent). One may assume that each block contains s significant coefficients, and that their precision is defined by the insertion of our hybrid quantizer between the transform encoder and entropy encoder. As the hybrid quantizer is well defined only for binary and Gaussian sources, "coefficient symbol planes" are created by assembling the $i^{th}$ coefficients from every block into the $i^{th}$ plane $p^{(i)}$:

$$p^{(i)} = [b_i^{(1)}, \ldots, b_i^{(N)}], i \in \{1, \ldots, s\}.$$

Since the coefficients are decorrelated by the DCT transform, it may be assumed that within a plane all coefficients are independently and identically distributed (i.i.d.) Gaussian values:

$$p_j^{(i)} \sim N(\mu, \sigma^2).$$

Hence, before insertion of the hybrid quantizer, some recombining of DCT coefficients is due.

Multiple video codecs modified in this manner, combined with erasure quantizers, constitute an embodiment of the joint hybrid encoder.

Figure 3A:
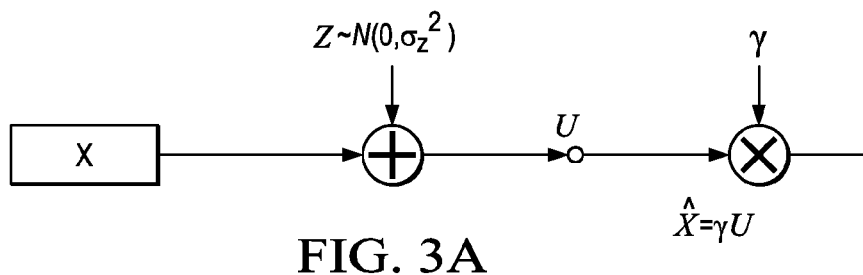
FIGs. 3A is a mathematical representation of an optimal quantizer for Gaussian source, at a given rate.
Figure 3B:
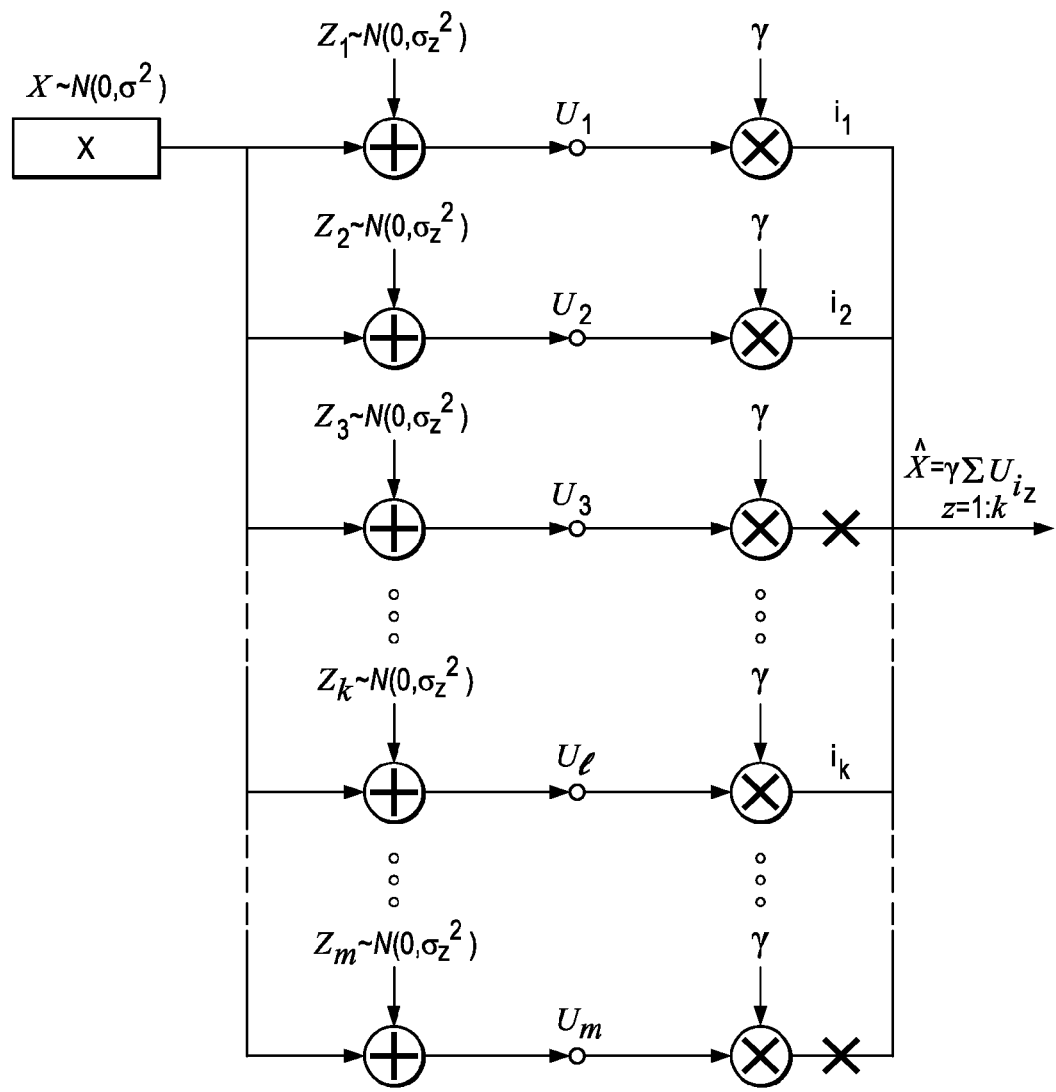
FIG. 3B is a mathematical representation of one embodiment of a joint encoder and joint decoder of FIG. 2 having optimal quantizers for the Gaussian sources of FIG. 3A.

FIG. 3A is a mathematical representation of an optimal quantizer for Gaussian source, at a given rate, and FIG. 3B is a mathematical representation of one embodiment of a joint encoder 210 and joint decoder 270 of FIG. 2 having optimal quantizers for the Gaussian sources of FIG. 3A. The configuration and operation of certain embodiments of the joint encoder 210 and joint decoder 270 will now be described. In the illustrated embodiment, the coefficients $p_j^{(i)}$ in each plane i are treated as Gaussian sources (represented in FIGS. 3A and 3B as a generic variable X), and each of the sources are quantized m times by optimal Gaussian quantizers 210 for rate C/m. Here C represents the maximum capacity of the content delivery medium (channel or network), normalized for each plane. FIG. 3A indicates that the optimal quantization is random, and each description is independently quantized, even though their distortion variance $\sigma_z^2$ is the same and determined by a minimum mean-square error estimation (MMSE) and rate-optimal criteria for the per-description distortion:

$$D_o = \sigma^2 2^{-2\frac{C}{m}} = \frac{\sigma^2 \sigma_z^2}{\sigma^2 + \sigma_z^2}.$$

At the decoder, if k descriptions have been received the optimal reconstruction is linear in their sum, and the linear coefficient is $$\gamma = \frac{\sigma^2}{k\sigma^2 + \sigma_z^2}.$$

When the decoder forms the reconstruction of the plane coefficients, the rest of the decoding may be the same as with conventional systems.

For the illustrated embodiment of the system, each description is quantized optimally for rate C/mx,x>1, and the quantized descriptions represented as bits. This might incur some quality loss, but conventional techniques suffer this aw well, and, as shown in Ziv, "On Universal Quantization," IEEE Trans. on Info. Theory, vol. 31, no. 3, 1985, a coding technique formed by a scalar uniform quantizer followed by entropy coding yields a rate penalty of no more than 0.754 bits per sample with respect to the R(D) limit. Thus, constraining the quantizer to be a uniform scalar quantizer should cost no more then a 0.754/C channel symbols per source symbols. The bits representing each $U_i$ are packed with bits representing unquantized coefficients $p_j^{(i)}$, up to the rate of C/m. In the illustrated embodiment, this rate ultimately defines the packet size.

Figure 4:
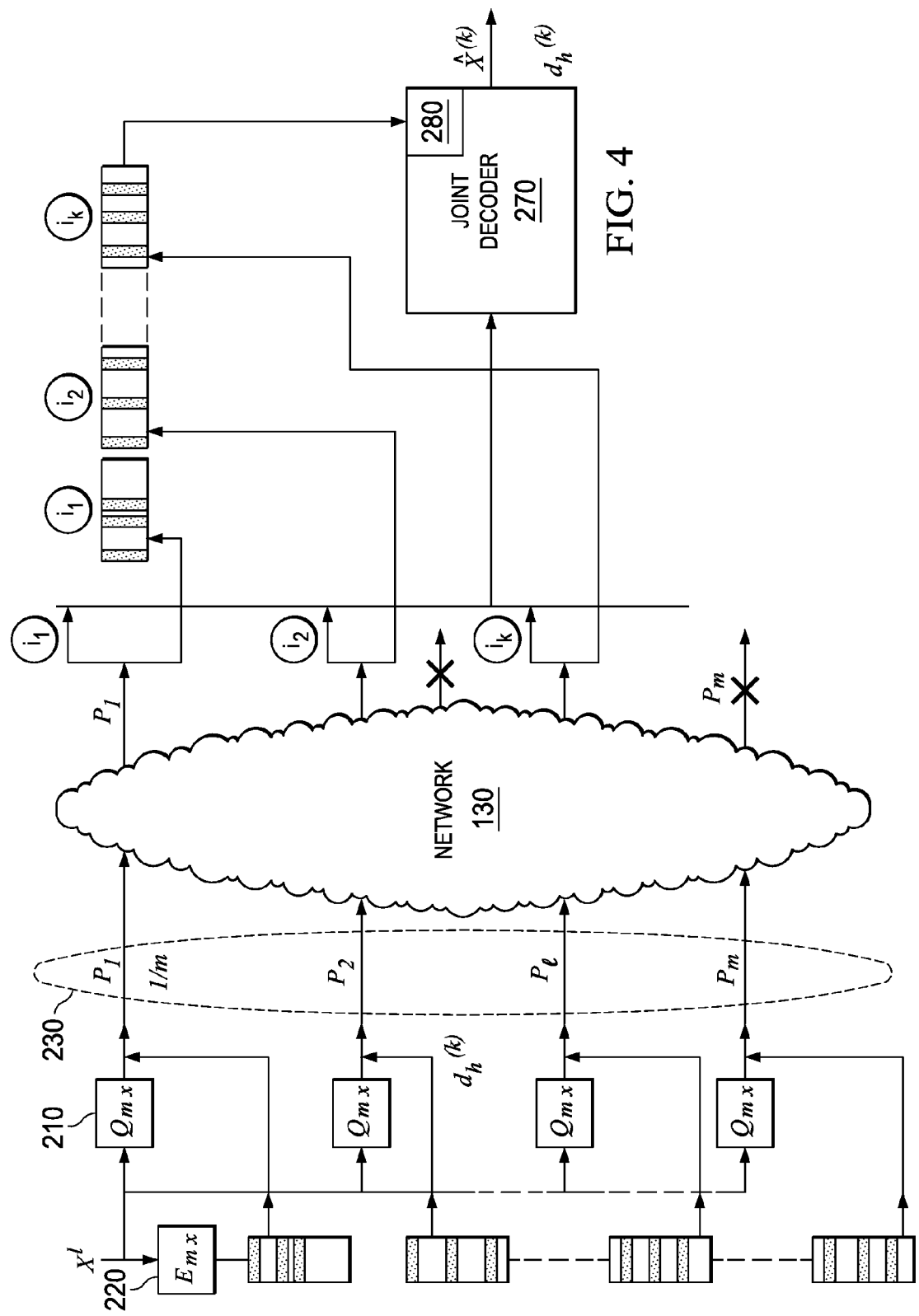
FIG. 4 is a schematic diagram of a different embodiment of a system for mitigating the cliff effect for content delivery over a heterogeneous network, applied to a conventional video encoder.

FIG. 4 is a schematic diagram of a different embodiment of a system for mitigating the cliff effect for content delivery over a heterogeneous network, applied to a conventional video encoder. In FIG. 4, X is the binary sequence created by interleaving uniformly quantized DCT coefficients. The interleaved bits, which are of length l, are treated as binary symmetric sources.

Figure 5:
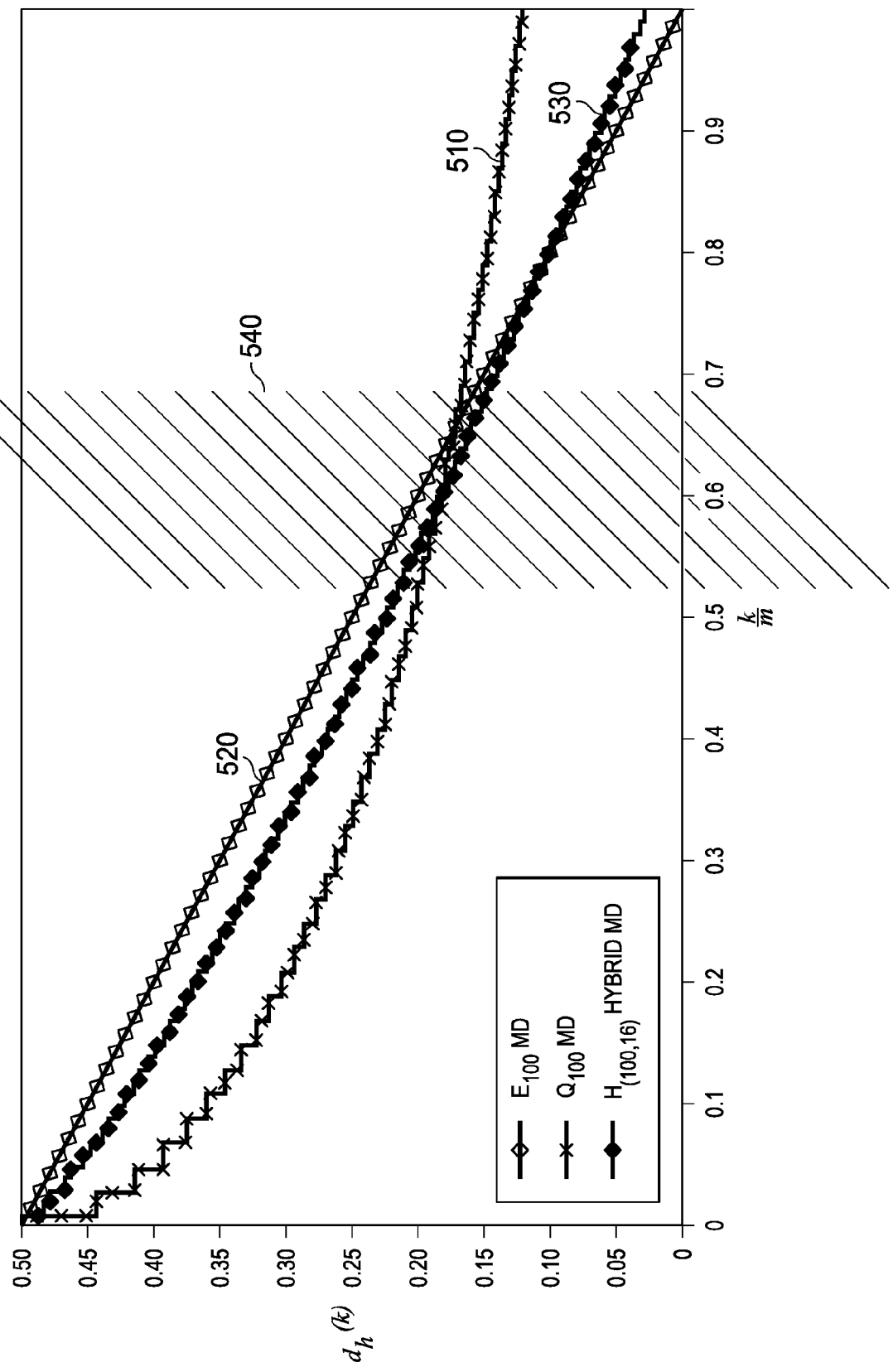
FIG. 5 is a graph comparing distortion as a function of channel quality for the joint decoder based on optimal quantizers, joint decoder based on an erasing quantizer, and joint decoder based on a hybrid quantizer.

FIG. 5 is a graph comparing distortion as a function of channel quality for a joint decoder, an erasing quantizer and a hybrid quantizer. A curve 510 relates distortion for a joint decoder of 100 optimally quantized descriptions operating on a content unit. A curve 520 relates distortion for a decoder of 100 disjointly erased subsets of a content unit. A curve 530 relates distortion for a joint decoder of 100 hybrid descriptions operating with a rate-splitting ratio of 16 on a content unit. It is apparent that the distortion is reduced in a region 540 of likelier channel states.

Figure 6:
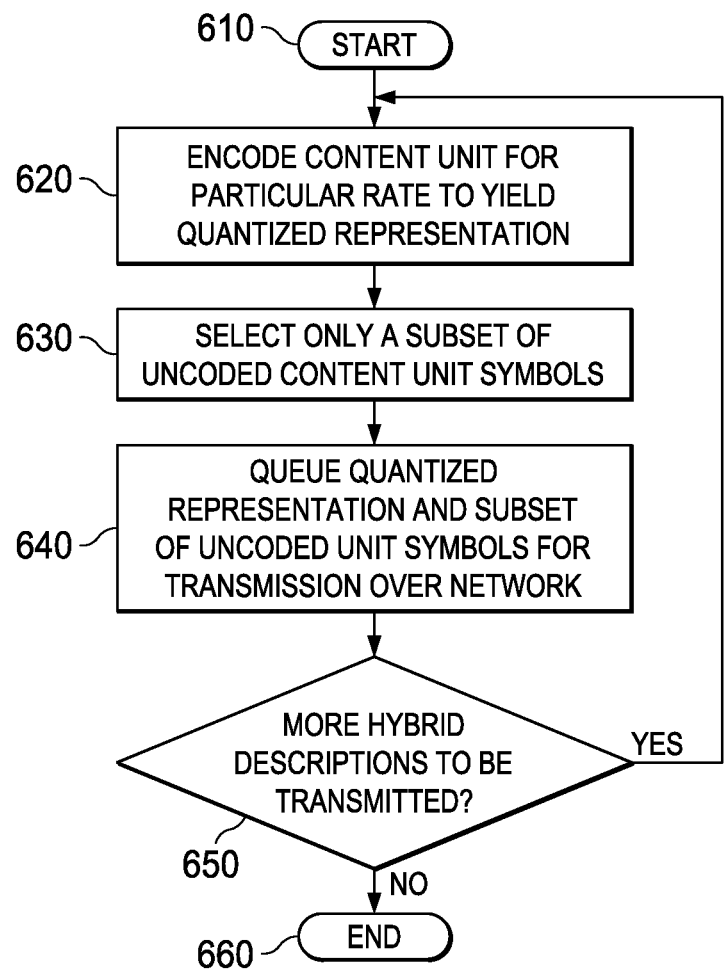
FIG. 6 is a flow diagram of one embodiment of a method of mitigating the cliff effect for content delivery over a heterogeneous network.

FIG. 6 is a flow diagram of one embodiment of a method of mitigating the cliff effect for content delivery over a heterogeneous network. The method begins in a start step 610. In a step 620, a content unit is encoded for a particular rate to yield a quantized representation. In a step 630, only a subset of uncoded content unit symbols is selected. In a step 640, the quantized representation and the subset of uncoded unit symbols are queued for transmission and thereafter transmitted over a network to various receivers. In one embodiment, the quantized representation and the uncoded unit symbol are assembled into a packet as a hybrid description and so queued for transmission. In a decisional step 650, it is determined whether more hybrid descriptions of that content unit are to be generated and transmitted. If so, the steps 620, 630, 640 are repeated as needed for each description. If not, the method ends in a step 650.

Those skilled in the art to which this application relates will appreciate that other and further additions, deletions, substitutions and modifications may be made to the described embodiments.

What is claimed is:

1. A transmitter for mitigating the cliff effect for content delivery over a heterogeneous network, comprising:
a joint encoder configured to receive a content unit and generate multiple quantized representations thereof; and
an erasing quantizer associated with said joint encoder and configured to select, from uncoded symbols representing said content unit, multiple subsets of said uncoded symbols,
said multiple quantized representations and said multiple subsets of said uncoded symbols being assembled into a packet as a hybrid description of said content unit.

2. The transmitter as recited in claim 1 wherein said erasing quantizer is further configured to select multiple permuted blocks of successive uncoded symbols and erase any remaining uncoded symbols.

3. The transmitter as recited in claim 1 wherein said joint encoder includes multiple instances of a conventional encoder configured to generate a single quantized representation of said content unit.

4. The transmitter as recited in claim 1 wherein said multiple quantized representations differ from one another in terms of rate.

5. The transmitter as recited in claim 1 wherein said hybrid description is optimized for likelier channel states.

6. The transmitter as recited in claim 1 wherein said multiple subsets of said uncoded symbols differ from one another.

7. The transmitter as recited in claim 1 wherein said multiple quantized representations are queued for transmission over disjoint channels in said heterogeneous network.

8. A method of mitigating the cliff effect for content delivery over a heterogeneous network, comprising:
encoding a content unit to yield a quantized representation of a particular rate;
selecting only a subset of uncoded content unit symbols;
queuing said quantized representation and said subset of uncoded content unit symbols for transmission over a network, wherin said quantized representation and said subset of uncoded content unit symbols are assembled into a packet as a hybrid description; and
repeating said encoding, selecting and queuing.

9. The method as recited in claim 8 wherein said selecting comprises:
selecting multiple permuted blocks of adjacent successive uncoded symbols; and
erasing any remaining uncoded symbols.

10. The method as recited in claim 8 further comprising optimizing said hybrid description based on a statistical description of channel states.

11. The method as recited in claim 8 further comprising optimizing said hybrid description for likelier channel states.

12. The method as recited in claim 8 wherein said subset of said uncoded content unit symbols differ from other subsets of said uncoded unit symbols.

13. The method as recited in claim 10 wherein said repeating is performed for other hybrid descriptions to be generated.

14. The method as recited in claim 8 wherein said queuing comprises queuing said quantized representation and said subset of uncoded content unit symbols for transmission over disjoint channels.

15. A receiver for mitigating the cliff effect for content delivery over a heterogeneous network, comprising:
a joint decoder configured to decode quantized representations extracted from received packets assembled as hybrid descriptions representing a content unit; and
a summing junction associated with said joint decoder and configured to employ at least one uncoded symbol representing said content unit to compensate for at least one corresponding symbol that said joint decoder failed to decode.

16. The receiver as recited in claim 15 wherein said joint decoder includes multiple instances of a conventional decoder configured to decode a single one of said quantized representations at a time.

17. The receiver as recited in claim 15 wherein said at least one uncoded symbol is multiple subsets of said uncoded symbols,said multiple subsets differing from one another.

18. The receiver as recited in claim 17 wherein said multiple subsets are received over disjoint channels in said heterogeneous network.

19. The receiver as recited in claim 15 wherein said content unit is selected from the group consisting of:
- a frame of video,
- a segment of audio, and
- a segment of computer data.

* * * * *